(12) United States Patent
Hsu et al.

(10) Patent No.: US 11,996,433 B2
(45) Date of Patent: May 28, 2024

(54) PAD STRUCTURE FOR FRONT SIDE ILLUMINATED IMAGE SENSOR

(71) Applicant: Taiwan Semiconductor Manufacturing Company, Ltd., Hsin-Chu (TW)

(72) Inventors: Kai-Chun Hsu, Yonghe (TW); Ching-Chun Wang, Tainan (TW); Dun-Nian Yaung, Taipei (TW); Jeng-Shyan Lin, Tainan (TW); Shyh-Fann Ting, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 219 days.

(21) Appl. No.: 17/729,258

(22) Filed: Apr. 26, 2022

(65) Prior Publication Data
US 2022/0254828 A1 Aug. 11, 2022

Related U.S. Application Data

(63) Continuation of application No. 17/070,430, filed on Oct. 14, 2020, now Pat. No. 11,322,540, which is a
(Continued)

(51) Int. Cl.
*H01L 27/146* (2006.01)
*H01L 23/00* (2006.01)

(52) U.S. Cl.
CPC ........ *H01L 27/14636* (2013.01); *H01L 24/05* (2013.01); *H01L 27/14603* (2013.01);
(Continued)

(58) Field of Classification Search
CPC .............................. H01L 23/00; H01L 27/146
See application file for complete search history.

(56) References Cited

U.S. PATENT DOCUMENTS

| 8,173,539 | B1 | 5/2012 | Huang et al. |
| 2001/0051426 | A1 | 12/2001 | Pozder et al. |

(Continued)

FOREIGN PATENT DOCUMENTS

TW 506027 B 10/2002

OTHER PUBLICATIONS

Non-Final Office Action dated Sep. 22, 2017 for U.S. Appl. No. 15/149,561.
(Continued)

*Primary Examiner* — Marvin Payen
(74) *Attorney, Agent, or Firm* — Eschweiler & Potashnik, LLC

(57) ABSTRACT

The present disclosure relates to a semiconductor structure. The semiconductor structure includes a dielectric layer having a first dielectric surface and a second dielectric surface opposite to the first dielectric surface. The dielectric layer defines a recess in the first dielectric surface, and the recess includes a sidewall of the dielectric layer. A first conductive layer contacts a bottom surface of the dielectric layer. The sidewall of the dielectric layer is directly over the first conductive layer. A second conductive layer contacts the first conductive layer and the dielectric layer. The second conductive layer vertically extends from the first conductive layer to above the dielectric layer. A third conductive layer contacts the second conductive layer. The third conductive
(Continued)

layer is laterally separated from a sidewall of the second conductive layer that faces the third conductive layer by a non-zero distance.

20 Claims, 9 Drawing Sheets

Related U.S. Application Data continuation of application No. 15/149,561, filed on May 9, 2016, now Pat. No. 10,833,119.

(60) Provisional application No. 62/246,358, filed on Oct. 26, 2015.

(52) U.S. Cl.
CPC .... *H01L 27/1462* (2013.01); *H01L 27/14645* (2013.01); *H01L 27/14685* (2013.01); *H01L 27/14621* (2013.01); *H01L 27/14627* (2013.01); *H01L 2224/0401* (2013.01); *H01L 2224/05017* (2013.01); *H01L 2224/05024* (2013.01); *H01L 2224/05026* (2013.01); *H01L 2224/05566* (2013.01); *H01L 2224/05573* (2013.01); *H01L 2224/05582* (2013.01); *H01L 2224/05686* (2013.01); *H01L 2924/14* (2013.01)

(56) References Cited

U.S. PATENT DOCUMENTS

| | | |
|---|---|---|
| 2004/0127001 A1 | 7/2004 | Colburn et al. |
| 2008/0116537 A1 | 5/2008 | Adkisson et al. |
| 2012/0161129 A1 | 6/2012 | Chen |
| 2013/0009270 A1 | 1/2013 | Tsai et al. |
| 2013/0043598 A1 | 2/2013 | Chen et al. |
| 2015/0035109 A1 | 2/2015 | Kataoka |
| 2016/0379960 A1 | 12/2016 | Huang et al. |

OTHER PUBLICATIONS

Final Office Action dated Apr. 3, 2018 for U.S. Appl. No. 15/149,561.
Non-Final Office Action dated Oct. 22, 2018 for U.S. Appl. No. 15/149,561.
Final Office Action dated Dec. 18, 2019 for U.S. Appl. No. 15/149,561.
Notice of Allowance dated Jul. 1, 2020 for U.S. Appl. No. 15/149,561.
Non-Final Office Action dated Nov. 27, 2019 for U.S. Appl. No. 16/040,567.
Notice of Allowance dated Jan. 7, 2022 for U.S. Appl. No. 17/070,430.

PAD STRUCTURE FOR FRONT SIDE ILLUMINATED IMAGE SENSOR

REFERENCE TO RELATED APPLICATIONS

This Application is a Continuation of U.S. application Ser. No. 17/070,430, filed on Oct. 14, 2020, which is a Continuation of U.S. application Ser. No. 15/149,561, filed on May 9, 2016 (now U.S. Pat. No. 10,833,119, issued on Nov. 10, 2020), which claims the benefit of U.S. Provisional Application No. 62/246,358, filed on Oct. 26, 2015. The contents of the above-referenced Patent Applications are hereby incorporated by reference in their entirety.

BACKGROUND

Integrated circuits (IC) with image sensors are used in a wide range of modern day electronic devices, such as cameras and cell phones, for example. Complementary metal-oxide semiconductor (CMOS) devices have become popular IC image sensors. Compared to charge-coupled devices (CCD), CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

FSI image sensors are an established technology that is favorable in lower-cost applications with larger pixels. In FSI image sensors, light falls on a front-side of an IC, and passes through a stack of back-end-of-line (BEOL) metal interconnect layers, before being collected at photodetectors. Often, the BEOL metal layers have openings over the individual photodetectors to improve transmission of light to the photodetectors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
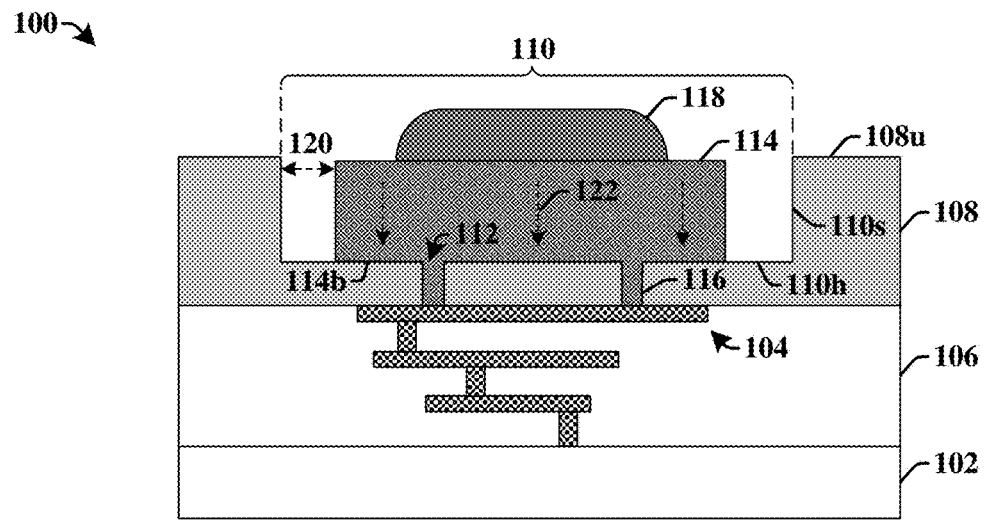
FIG. 1 illustrates a cross-sectional view of some embodiments of an integrated circuit having a bond pad that mitigates damage to underlying structures while having a relatively flat surface topography.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Front-side illuminated (FSI) image sensors are arranged within integrated circuits that have bond pads. The bond pads are configured to couple the integrated circuits to printed circuit boards or other external circuitry by way of conductive balls (e.g., a solder ball or a C4 micro-bump) formed onto the bond pads. Conventional bond pads are often formed directly onto an underlying metal interconnect layer within a back-end-of-the-line (BEOL) metallization stack. However, in emerging technology nodes, the BEOL metallization stack often comprises copper interconnect layers within low-k dielectric layers to provide for a relatively low RC delay. It has been appreciated that copper interconnect layers arranged within low-k dielectric layers are structurally weak. Therefore, when a bond pad is formed directly onto an underlying metal interconnect layer it can cause problems during formation of the conductive ball. For example, the force of a bond connection can cause deformation and/or cracking of the metal interconnect layer thereby damaging the integrated circuit.

Passivation layers can be formed over the BEOL metallization stack to provide for an increased structural support for an overlying bond pad. However, such passivation layers cause topography problems in CMOS image sensor (CIS) applications. This is because forming a bond pad over one or more passivation layers causes the bond pad to have a relatively large height that will impact the subsequent formation of color filters and thereby decrease performance (e.g., efficiency) of an image sensor. For example, the relatively large height of the bond pad may cause an additional passivation layer overlying the bond pad to have a non-planar topography that results in difficulties (e.g., photoresist non-uniformity, depth of focus issues) in lithography processes used to form color filters over the additional passivation layer.

The present disclosure relates to an integrated circuit having a bond pad that mitigates damage to underlying layers while having a relatively flat surface topography that provides for good image sensor performance. In some embodiments, the integrated circuit has a plurality of metal interconnect layers arranged within a dielectric structure over a substrate. A passivation structure is arranged over the dielectric structure and has a recess with sidewalls connecting a horizontal surface of the passivation structure to upper surfaces of the passivation structure. A bond pad is arranged within the recess and has a lower surface overlying the horizontal surface. One or more protrusions extend outward from the lower surface of the bond pad through openings in the passivation structure to contact an underlying metal interconnect layer. Arranging the bond pad within the recess and over the passivation structure mitigates stress to underlying layers during bonding while providing a relatively flat topography that does not negatively impact an efficiency of a front-side image sensing element within the substrate.

FIG. 1 illustrates a cross-sectional view of some embodiments of an integrated circuit 100 having a bond pad that mitigates damage to underlying structures while having a relatively flat surface topography.

The integrated circuit 100 comprises a dielectric structure 106 arranged over a semiconductor substrate 102. A plurality of metal interconnect layers 104 are arranged within the dielectric structure 106. In some embodiments, the dielectric structure 106 may comprise a plurality of stacked dielectric layers, and the plurality of metal interconnect layers 104 may comprise a plurality of metal wires and/or vias arranged within the stacked dielectric layers. In some embodiments, the plurality of metal interconnect layers 104 may be copper.

A passivation structure 108 comprising one or more passivation layers is arranged over the dielectric structure 106. The passivation structure 108 has a recess 110 comprising a depression arranged within an upper surface 108u of the passivation structure 108. The recess 110 comprises sidewalls 110s that connect a horizontal surface 110h of the recess 110 to the upper surface 108u of the passivation structure 108. The passivation structure 108 further comprises one or more openings 112 disposed within the horizontal surface 110h of the recess 110. The one or more openings 112 extend through the passivation structure 108, from the recess 110 to an underlying one of the plurality of metal interconnect layers 104.

A bond pad 114 is arranged within the recess 110 in the passivation structure 108. The bond pad 114 comprises a conductive material (e.g., a metal such as aluminum) that is configured to provide an electrical connection between the integrated circuit 100 and an external device. For example, a conductive bump 118 (e.g., a solder bump) may be arranged onto the bond pad 114 to connect the bond pad 114 to an external I/O pin of an integrated chip package. The bond pad 114 has a lower surface 114b that overlies the passivation structure 108. The bond pad 114 further comprises one or more protrusions 116 extending outward from the lower surface 114b. The one or more protrusions 116 extend through the one or more openings 112 to provide for an electrical connection between the bond pad 114 and the one or more metal interconnect layers 104. In some embodiments, the bond pad 114 may be separated from sidewalls 110s of the recess 110 within the passivation structure 108 by a cavity 120. In some embodiments, the bond pad 114 is not arranged over the upper surfaces 108u of the passivation structure 108.

Because the bond pad 114 has a lower surface 114b that overlies the passivation structure 108, the bond pad 114 is able to transfer stress 122 (i.e., force) from a bonding process (e.g., a wire bond process or a flip-chip process) to the passivation structure 108, thereby limiting damage to the metal interconnect layers 104 by mitigating the transfer of stress from the bonding process to the metal interconnect layers 104. Furthermore, because the bond pad 114 is arranged within a recess 110 within the passivation structure, the bond pad 114 is able to have a relatively flat surface topography. The relatively flat surface topography allows for the bond pad 114 to be used in image sensor applications without negatively impacting the formation of color filters over the passivation structure 108.

Figure 2:
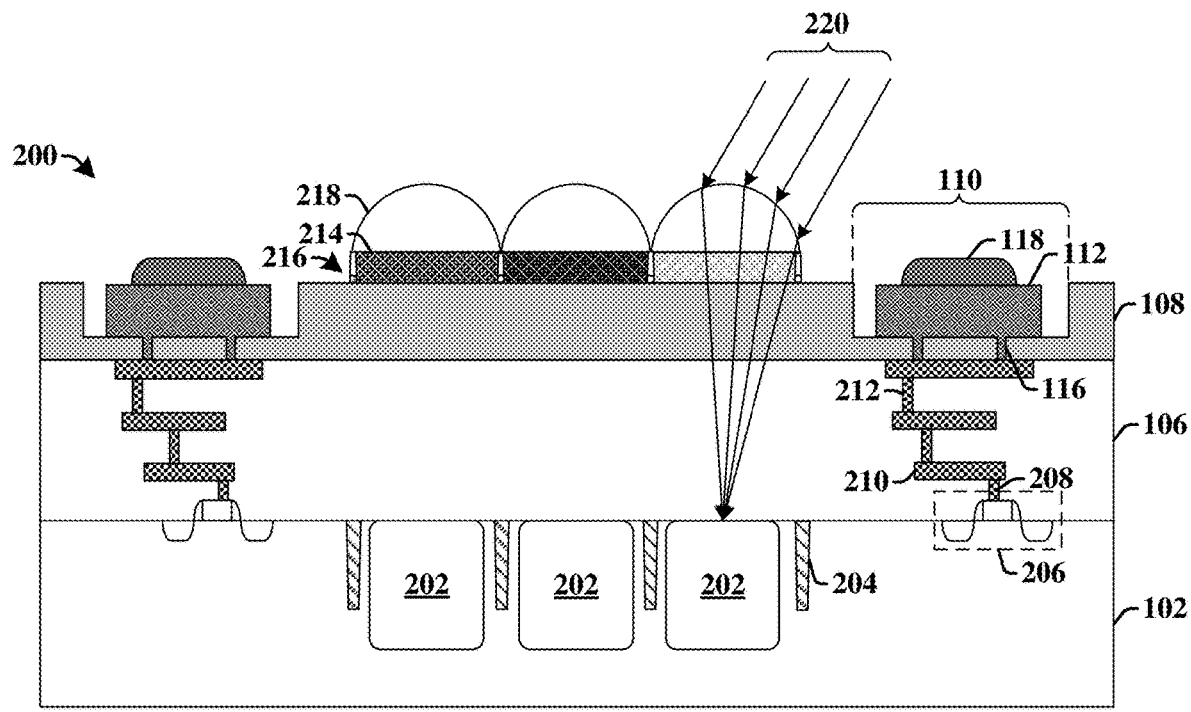
FIG. 2 illustrates a cross-sectional view of some embodiments of a front-side illuminated (FSI) image sensor having a bond pad as shown in FIG. 1.

FIG. 2 illustrates a cross-sectional view of some embodiments of a front-side illuminated (FSI) image sensor 200 having a bond pad, as shown in FIG. 1.

The FSI image sensor 200 comprises a plurality of image sensing elements 202 arranged within a semiconductor substrate 102. The image sensing elements 202 are configured to generate charge carriers (e.g., electron-hole pair) from incident radiation 220. In some embodiments, the image sensing elements 202 may comprise photodiodes. The photodiodes may have a first region with a first doping type (e.g., n-type doping) and an abutting second region with a second doping type (e.g., p-type doping) that is different than the first doping type. In some embodiments, the first and/or second regions may have doping concentrations greater than or equal to approximately 5e15 atoms/cm$^3$. In some embodiments, the image sensing elements 202 may be isolated from adjacent image sensing elements 202 by one or more isolation structures 204 (e.g., shallow trench isolation regions, deep trench isolation regions).

A dielectric structure 106 is arranged over the semiconductor substrate 102. The dielectric structure 106 comprises a plurality of stacked inter-metal dielectric (IMD) layers. In various embodiments, the plurality of stacked IMD layers may comprise one or more of a low-k dielectric layer (i.e., a dielectric with a dielectric constant less than about 3.9), an ultra low-k dielectric layer, or an oxide (e.g., silicon oxide). A plurality of metal interconnect layers 208-212 may be arranged within the dielectric structure 106. The plurality of metal interconnect layers may comprise conductive contacts 208, metal interconnect wires 210, and metal vias 212. The conductive contacts 208 may be connected to a transistor device 206 arranged within the semiconductor substrate 102. In various embodiments, the conductive contacts 208 may comprise a conductive metal such as copper or tungsten, for example. In various embodiments, the metal interconnect wires 210 and metal vias 212 may comprise a conductive metal such as copper.

A passivation structure 108 is arranged over the dielectric structure 106. The passivation structure 108 may comprise one or more of dielectric layers, such as an oxide (e.g., silicon dioxide) and/or a nitride (e.g., silicon nitride), for example. In some embodiments, the passivation structure 108 may comprise a plurality of stacked dielectric layers. The passivation structure 108 has recesses 110 arranged at locations that are laterally offset from the image sensing elements 202. Bond pads 114 are arranged within the recesses 110. The bond pads 114 respectively comprise protrusions 116 extending through the passivation structure 108 to electrically contact the plurality of metal interconnect layers 208-212.

A plurality of color filters 214 are arranged over the passivation structure 108. The plurality of color filters 214 are respectively configured to transmit specific wavelengths of radiation. For example, a first color filter (e.g., a red color filter) may transmit radiation having wavelengths within a first range, while a second color filter (e.g., a green color filter) may transmit radiation having wavelengths within a second range different than the first range. In some embodiments, the plurality of color filters 214 may be surrounded by a grid structure 216. In some embodiments, the grid structure 216 may comprise a stacked structure having a dielectric material (e.g., silicon nitride) and an overlying metal layer. The grid structure 216 forms a framework that defines a plurality of openings located over the underlying image sensing elements 202.

A plurality of micro-lenses 218 are arranged over the plurality of color filters 214. The plurality of micro-lenses 218 are respectively aligned with the color filters 214 and overlie the image sensing elements 202. In some embodiments, the plurality of micro-lenses 218 have a substantially flat bottom surface abutting the color filters 214, and a curved upper surface. The curved upper surface is configured to focus the incident radiation 220 onto a center of an underlying image sensing element 202 to increase efficiency of the image sensing element 202.

Figure 3:
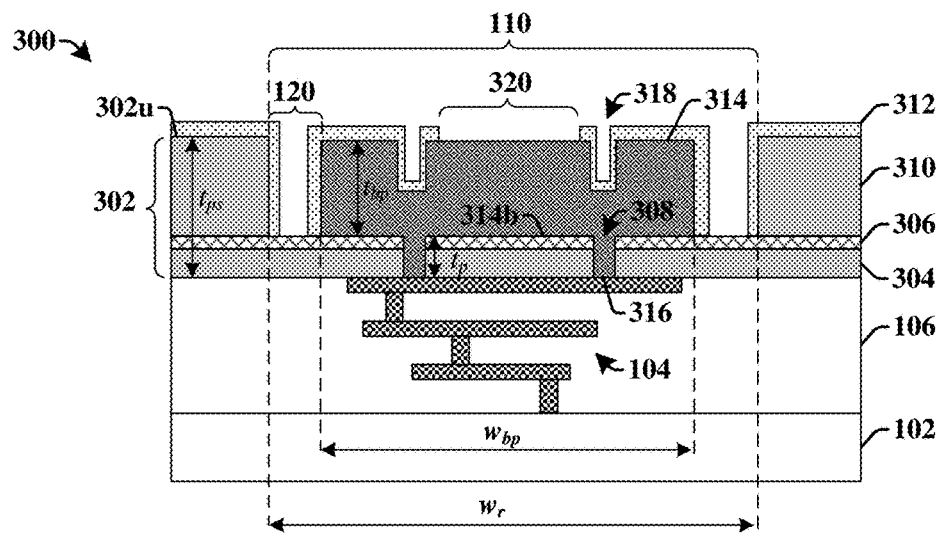
FIG. 3 illustrates a cross-sectional view of some alternative embodiments of an integrated circuit having a bond pad.

FIG. 3 illustrates a cross-sectional view of some alternative embodiments of an integrated circuit 300 having a bond pad.

The integrated circuit 300 comprises a passivation structure 302 separated from a semiconductor substrate 102 by a dielectric structure 106 surrounding a plurality of metal interconnect layers 104. The passivation structure 302 comprises a first passivation layer 304, a second passivation layer 306, and a third passivation layer 310. The first passivation layer 304 is arranged onto the dielectric structure 106. In some embodiments, the first passivation layer 304 is a substantially planar layer. The second passivation layer 306 is arranged over the first passivation layer 304 and forms a lower surface of a recess 110 within the passivation structure 302. The third passivation layer 310 is arranged onto the second passivation layer 306 and forms sidewalls of the recess 110 within the passivation structure 302. In some embodiments, the first passivation layer 304 may comprise an oxide (e.g., silicon dioxide), the second passivation layer 306 may comprise a nitride (e.g., silicon nitride), and the third passivation layer may 310 comprise an oxide (e.g., silicon dioxide).

A bond pad 314 is arranged within the recess 110 in the passivation structure 302. The bond pad 314 comprises a lower surface 314b that contacts the second passivation layer 306. The bond pad 314 further comprise one or more protrusions 316 that extend through openings 308 in the first passivation layer 304 and the second passivation layer 306 to an underlying one of the plurality of metal interconnect layers 104. In some embodiments, the upper surface of the bond pad 314 comprises one or more depressions 318 that are arranged vertically over the one or more protrusions 316. In some embodiments, the recess 110 within the passivation structure 302 has a larger width $w_r$ than the width $w_{bp}$ of the bond pad 314. This causes the bond pad 314 to be laterally separated from the sidewalls of the recess 110 (i.e., from the third passivation layer 310) by a cavity 120.

The protrusions 316 extending outward from the lower surface 314b of the bond pad 314 have a thickness $t_p$ that is less than or equal to a thickness $t_{ps}$ of the passivation structure 302. This allows for the bond pad 314 to be recessed with respect to an upper surface 302u of the passivation structure 302, thereby providing for a flat topography of the passivation structure 302. In some embodiments, a top surface of the bond pad 314 may be at or below a top surface of the passivation structure 302. In other embodiments, the top surface of the bond pad 314 may be slightly above the top surface of the passivation structure 302. In some embodiments, the bond pad 314 may have a thickness $t_{bp}$ that is in a range of between approximately 2,000 angstroms and approximately 50,000 angstroms, while the protrusions 316 have a thickness $t_p$ that is in a range of between approximately 100 angstroms and approximately 600 angstroms.

An upper passivation layer 312 is arranged over the passivation structure 302 and the bond pad 314. The upper passivation layer 312 is also arranged along sidewalls and a lower surface of the cavities 120 between the passivation structure 302 and the bond pad 314. The upper passivation layer 312 has an opening 320 that exposes an upper surface of the bond pad 314. A conductive bump (not shown) may be arranged on the bond pad 314 within the opening 320 in the upper passivation layer 312. In some embodiments, the upper passivation layer 312 may comprise an oxide or a nitride, for example.

Figure 4:
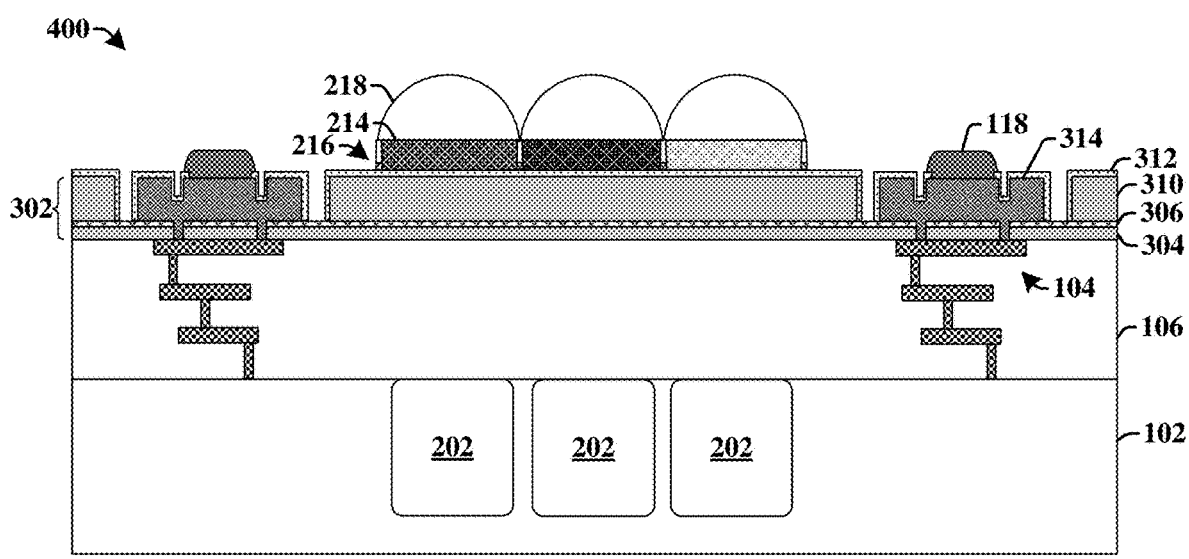
FIG. 4 illustrates a cross-sectional view of some embodiments of a FSI image sensor having a bond pad as shown in FIG. 3.

FIG. 4 illustrates a cross-sectional view of some embodiments of a FSI image sensor 400 having a bond pad as shown in FIG. 3.

The FSI image sensor 400 comprises a passivation structure 302 having a first passivation layer 304, a second passivation layer 306, and a third passivation layer 310 that extend over the dielectric structure 106 from recesses 110 comprising bond pads 314 to between the dielectric structure 106 and a plurality of color filters 214. The flat topography of the passivation structure 302 allows for the color filters 214 to be formed on a relatively flat surface, thereby preventing the passivation structure 302 from negatively impacting an efficiency of image sensing elements 202.

Figure 5A:
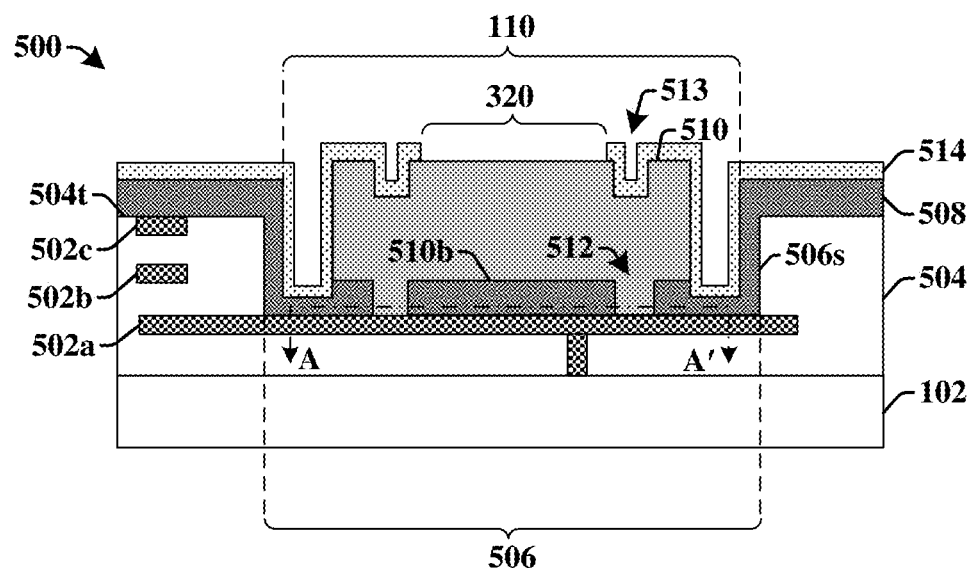
FIGS. 5A-5B illustrate some alternative embodiments of an integrated circuit having a bond pad.

FIG. 5A illustrates some alternative embodiments of an integrated circuit 500 having a bond pad. Although not illustrated, it will be appreciated that integrated circuit 500 may comprise an FSI image sensor (e.g., as shown in FIG. 2 or 4).

The integrated circuit 500 comprises a plurality of metal interconnect layers 502a-502c arranged within a dielectric structure 504 over a semiconductor substrate 102. The plurality of metal interconnect layers 502a-502c comprise a lower metal interconnect layer 502a and one or more upper metal interconnect layers, 502b and 502c, vertically arranged between the lower metal interconnect layer 502a and a top surface 504t of the dielectric structure 504. In some embodiments, the metal interconnect layers 502a-502c may comprise metal interconnect wires. In some embodiments, the lower metal interconnect layer 502a may comprise a first metal interconnect wire (i.e., an 'M1' metal interconnect wire within an IMD layer closest to the semiconductor substrate 102). In other embodiments, the lower metal interconnect layer 502a may be separated from the semiconductor substrate 102 by one or more additional metal wire layers (e.g., the lower metal interconnect layer 502a may be an 'M2' metal interconnect wire, an 'M3' metal interconnect wire, etc.).

A recess 506 is arranged within the top surface 504t of the dielectric structure 504. The recess 506 comprises sidewalls 506s that extend from the top surface 504t to the lower metal interconnect layer 502a. In some embodiments, the recess 506 is laterally positioned along-side the one or more upper metal interconnect layers, 502b and 502c. A passivation structure 508 comprises a passivation layer conformally arranged along sidewalls and a lower surface of the recess 506. This causes the passivation structure 508 to have a recess 110 overlying the lower metal interconnect layer 502a.

A bond pad 510 is arranged within the recess 110 in the passivation structure 508. The bond pad 510 has a lower surface 510b contacting the passivation structure 508. The bond pad 510 further comprises one or more protrusions 512 extending outward from the lower surface 510b, through the passivation structure 508 to the lower metal interconnect layer 502b. In some embodiments, one or more depressions 513 are arranged along an upper surface of the bond pad 510 over the protrusions 512. An upper passivation layer 514 is arranged over the passivation structure 508 and the bond pad 510.

Figure 5B:
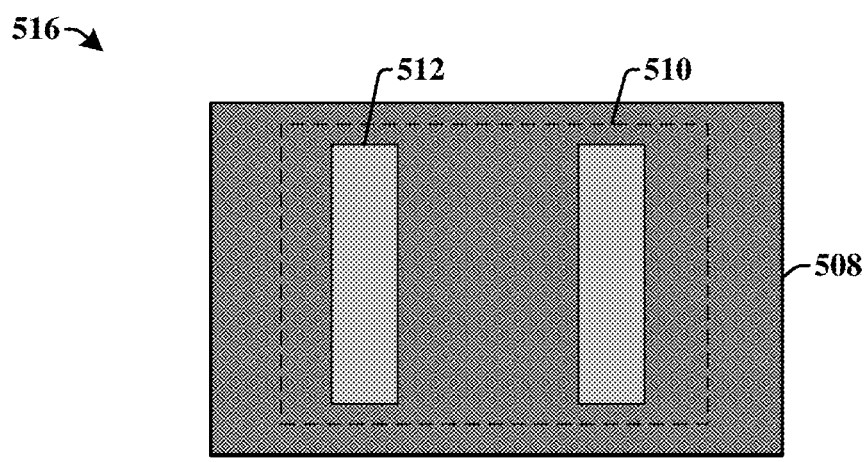

In some embodiments, as shown in top-view 516 of FIG. 5B (along cross-sectional line A-A' of FIG. 5A), the protrusions 512 may comprise oblong shapes that protrude through the passivation structure 508 at positions separated along a direction of a short axis of the protrusions 512. In some embodiments, the protrusions 512 may respectively have an area that is between approximately 40 um and approximately 800 um.

Figure 6A:
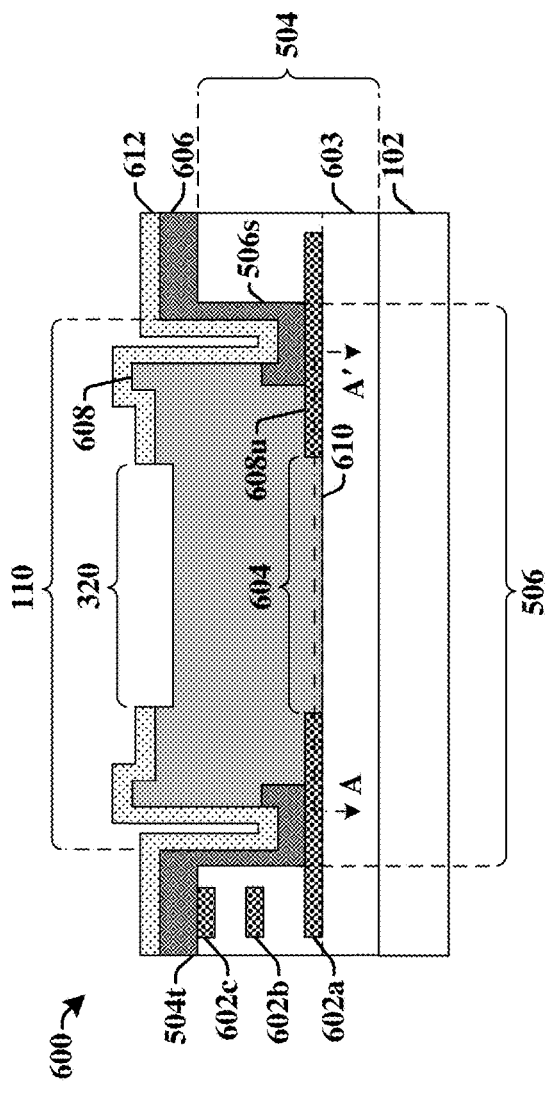
FIGS. 6A-6C illustrate some alternative embodiments of an integrated circuit having a bond pad.

FIG. 6A illustrates some alternative embodiments of an integrated circuit 600 having a bond pad. Although not illustrated, it will be appreciated that integrated circuit 600 may comprise an FSI image sensor (e.g., as shown in FIG. 2 or 4).

The integrated circuit 600 comprises a plurality of metal interconnect layers 602a-602c arranged within a dielectric structure 504 over a semiconductor substrate 102. The plurality of metal interconnect layers 602a-602c comprise a lower metal interconnect layer 602a and one or more upper metal interconnect layers, 602b and 602c, vertically arranged between the lower metal interconnect layer 602a and a top surface 504t of the dielectric structure 504. In some embodiments, the metal interconnect layers 602a-602c may comprise metal interconnect wires. The lower metal interconnect layer 602a is arranged within an inter-metal dielectric (IMD) layer overlying an inter-level dielectric (ILD) layer 603 (e.g., laterally surrounding conductive contacts contacting a semiconductor device). In some embodiments, the IMD layer comprises a porous low-k dielectric layer, while the ILD layer 603 comprises a non-low-k dielectric layer (e.g., an oxide) having greater structural stability than the IMD layer.

The lower metal interconnect layer 602a has an opening 604. In some embodiments, the opening 604 may extend through the lower metal interconnect layer 602a to the ILD layer 603. In other embodiments, the opening 604 may extend through the lower metal interconnect layer 602a and the ILD layer 603 to the semiconductor substrate 102.

A recess 506 is arranged within a top surface 504t of the dielectric structure 504. The recess 506 comprises sidewalls 506s that extend from the top surface 504t to the lower metal interconnect layer 602a. A passivation structure 606 is conformally arranged along the sidewalls 506s and a lower surface of the recess 506. This causes the passivation structure 606 to have a recess 110 overlying the lower metal interconnect layer 602a.

A bond pad 608 is arranged within the recess 110 in the passivation structure 606. The bond pad 608 has a lower surface 608u contacting the passivation structure 606. The bond pad 608 further comprises a protrusion 610 extending outward from the lower surface 608u, through the opening 604 in the lower metal interconnect layer 602a. In some embodiments, the protrusions 610 may extend outward from the lower surface 608u, through the opening 604 in the lower metal interconnect layer 602a to the ILD layer 603. Since the ILD layer 603 is not a porous low-k dielectric layer it is able to provide further structural support to the bond pad 608. In other embodiments, the protrusion 610 may extend outward from the lower surface 608u, through the opening 604 in the lower metal interconnect layer 602a to the semiconductor substrate 102 and/or a shallow trench isolation (STI) layer (not shown) within the semiconductor substrate 102. The semiconductor substrate 102 and/or the STI layer are able to provide further structural support to the bond pad 608. An upper passivation layer 612 is arranged over the passivation structure 606 and the bond pad 608.

Figure 6C:
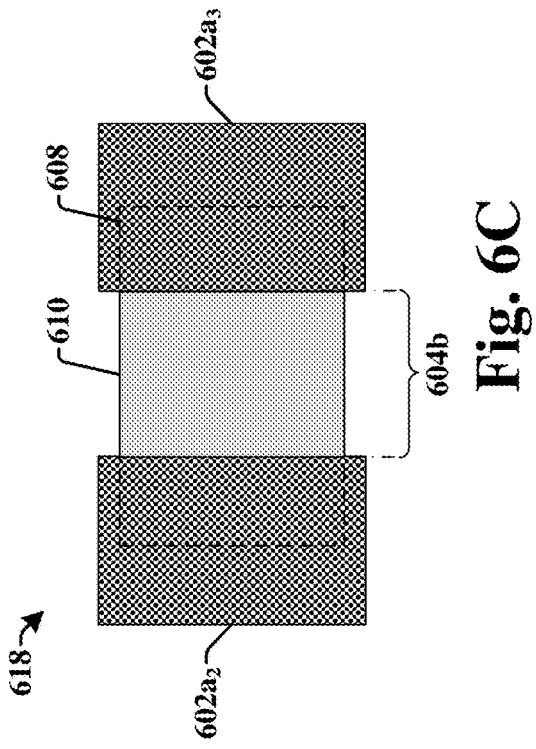
Figure 6B:
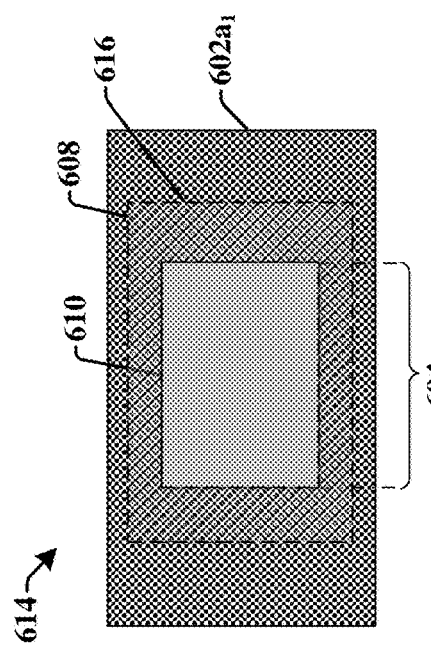

In some embodiments, as shown in top-view 614 of FIG. 6B (along cross-sectional line A-A' of FIG. 6A), the lower metal interconnect layer $602a_1$ may comprise a ring shape having an opening 604a enclosed by the lower metal interconnect layer $602a_1$. The bond pad 608 straddle edges of the ring shape. In some embodiments, the overlap area 616 of the bond pad 608 and the lower metal interconnect layer $602a_1$ may be in a range of between approximately 10 um$^2$ and approximately 5,000 um$^2$ In other embodiments, as shown in top-view 618 of FIG. 6C (along cross-sectional line A-A' of FIG. 6A), the lower metal interconnect layer may comprise a first plate $602a_2$ and a second plate $602a_3$ separated by an opening 604b. The bond pad 608 straddles the opening 604b so that a first end of the bond pad 608 overlies the first plate $602a_2$ and a second end of the bond pad 608 overlies the second plate $602a_3$.

FIGS. 7-15 illustrate cross-sectional views 700-1500 of some embodiments of a method of forming a front-side illuminated (FSI) image sensor having a bond pad.

As shown in cross-sectional view 700, a semiconductor substrate 102 is provided. The semiconductor substrate 102 may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. The semiconductor substrate 102 may comprise an intrinsically doped semiconductor substrate having a first doping type (e.g., an n-type doping or a p-type doping).

An image sensing element 202 is formed within the semiconductor substrate 102. In some embodiments, the image sensing element 202 may comprise a photodiode. In such embodiments, the photodiode may be formed by selectively implanting the semiconductor substrate 102 with one or more dopant species to form one or more doped regions within the semiconductor substrate 102. For example, in some embodiments, an implantation process is performed to implant a first dopant species 704 into a semiconductor substrate 102 according to a first masking layer 702 (e.g., photoresist) to form a first region having a first doping type within a semiconductor substrate having a second doping type (e.g., p-type doping). In other embodiments, one or more additional implantations may be performed to form a second region abutting the first region and having the second doping type.

As shown in cross-sectional view 800, a plurality of metal interconnect layers 502a-502c are formed within a dielectric structure 802 formed over the semiconductor substrate 102. In some embodiments, the plurality of metal interconnect layers 502a-502c comprise a lower metal interconnect layer 502a and one or more upper metal interconnect layers, 502b and 502c, vertically arranged between the lower metal interconnect layer 502a and a top surface 504t of the dielectric structure 504. In some embodiments, the metal interconnect layers 502a-502c may comprise metal interconnect wires. In some embodiments, the dielectric structure 802 comprises an ILD layer 802a (e.g., an oxide) and a plurality of IMD layers 802b-802d (e.g., low-k dielectric layers) arranged over the ILD layer 802a.

The plurality of metal interconnect layers 502a-502c may be formed by forming an ILD or IMD layer (e.g., 802a) over the semiconductor substrate 102. The ILD or IMD layer is subsequently etched to form via holes and/or metal trenches. The via holes and/or metal trenches are then filled with a conductive material to form one or more of the plurality of metal interconnect layers 502a-502c. In some embodiments, the ILD layer 802a and the IMD layers 802b-802d may be deposited by a separate physical vapor deposition processes (e.g., PVD, CVD, etc.). The plurality of metal interconnect layers 502a-502c may be formed using separate deposition and/or a plating processes (e.g., electroplating, electro-less plating, etc.). In various embodiments, the plurality of metal interconnect layers 502a-502c may comprise tungsten, copper, or aluminum copper, for example.

As shown in cross-sectional view 900, the dielectric structure 504 is selectively etched to form a recess 506 within a top surface 504t of the dielectric structure 504. The recess 506 has sidewalls 506s that extend from the top surface 504t to one of the plurality of metal interconnect layers 502a-502c. In some embodiments, dielectric structure 504 may be selectively exposed to an etchant 904 according to a second masking layer 902. In various embodiments, the etchant 904 may comprise a dry etchant (e.g., an RIE etch, a plasma etch, etc.) or a wet etchant (e.g., hydroflouric acid).

As shown in cross-sectional view 1000, a passivation structure 1002 is formed over the dielectric structure 504. In some embodiments, the passivation structure 1002 is arranged along the top surface 504t of the dielectric structure 504 and extends from within the recess 506 to over the image sensing element 202. The passivation structure 1002 further lines interior surfaces of the recess 506, so as to cause the passivation structure to have a recess 110. In some embodiments, the passivation structure 1002 may comprise an oxide layer. In other embodiments, the passivation structure 1002 may comprise a plurality of stacked passivation layers. For example, the passivation structure 1002 may comprise a first oxide layer, a nitride layer arranged onto the first oxide layer, and a second oxide layer arranged onto the nitride layer. In some embodiments, the passivation structure 1002 may be deposited by way of one or more vapor deposition processes (e.g., chemical vapor deposition (CVD), physical vapor deposition (PVD), plasma enhanced chemical vapor deposition (PECVD), etc.).

As shown in cross-sectional view 1100, the passivation structure 508 is selectively etched to form one or more openings 1106. The one or more openings 1106 extend through the passivation structure 508 to the lower metal interconnect layer 502a. In some embodiments, passivation structure 508 may be selectively exposed to an etchant 1104 according to a third masking layer 1102. In various embodiments, the etchant 1104 may comprise a dry etchant (e.g., an RIE etch, a plasma etch, etc.) or a wet etchant (e.g., hydroflouric acid).

As shown in cross-sectional view 1200, a bond pad 510 is formed within the recess 506. The bond pad 510 is formed to fill the one or more openings 1106 with the passivation structure 508, resulting in one or more protrusions 512 extending outward from a lower surface 510b of the bond pad 510 through the passivation structure 508. The bond pad 510 has a width that is less than a width of the recess 506 within the passivation structure 508, so that the bond pad 510 is laterally separated from sidewalls of the passivation structure 508 by a cavity 120. In some embodiments, the bond pad 510 may be formed by forming a metal layer over the passivation structure 508 and subsequently patterning the metal layer. For example, an aluminum seed layer may be formed onto the passivation structure 508 followed by a plating process to form a thick layer of aluminum. The thick layer of aluminum may be subsequently etched according to an overlying masking layer (not shown) to form the bond pad 510.

As shown in cross-sectional view 1300, an upper passivation layer 518 is formed over the passivation structure 508 and the bond pad 510. The upper passivation layer 518 lines sidewalls and lower surfaces of the cavities 120 between the bond pad 510 and the passivation structure 508. In some embodiments, the upper passivation layer 518 may comprise an oxide or a nitride (e.g., silicon nitride) formed by a vapor deposition process (e.g., PVD, CVD, PE-CVD, ALD, etc.).

As shown in cross-sectional view 1400, the upper passivation layer 518 is selectively etched to form an opening 320 that exposes an upper surface of the bond pad 510. A conductive bump 118 may be formed on the bond pad 510 within the opening 320 in the upper passivation layer 518.

As shown in cross-sectional view 1500, a grid structure 216 is formed over the upper passivation layer 518 at a location offset from the bond pad 510. The grid structure 216 may be formed by forming a dielectric (e.g., silicon-dioxide ($SiO_2$)) onto an upper surface of the upper passivation layer and a metal over the dielectric. The dielectric and metal are then selectively etched to define one or more openings within the grid structure 216. A plurality of color filters 214 are then formed to fill the openings. In some embodiments, the plurality of color filters 214 may be formed by forming a color filter layer to fill the openings and then patterning the color filter layer. The color filter layer is formed of a material that allows for the transmission of radiation (e.g., light) having a specific range of wavelength, while blocking light of wavelengths outside of the specified range.

A plurality of micro-lenses 218 are formed over the plurality of color filters 214. In some embodiments, the micro-lenses 218 may be formed by depositing a micro-lens material above the plurality of color filters 214 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 218 are then formed by selectively etching the micro-lens material according to the micro-lens template.

Figure 16:
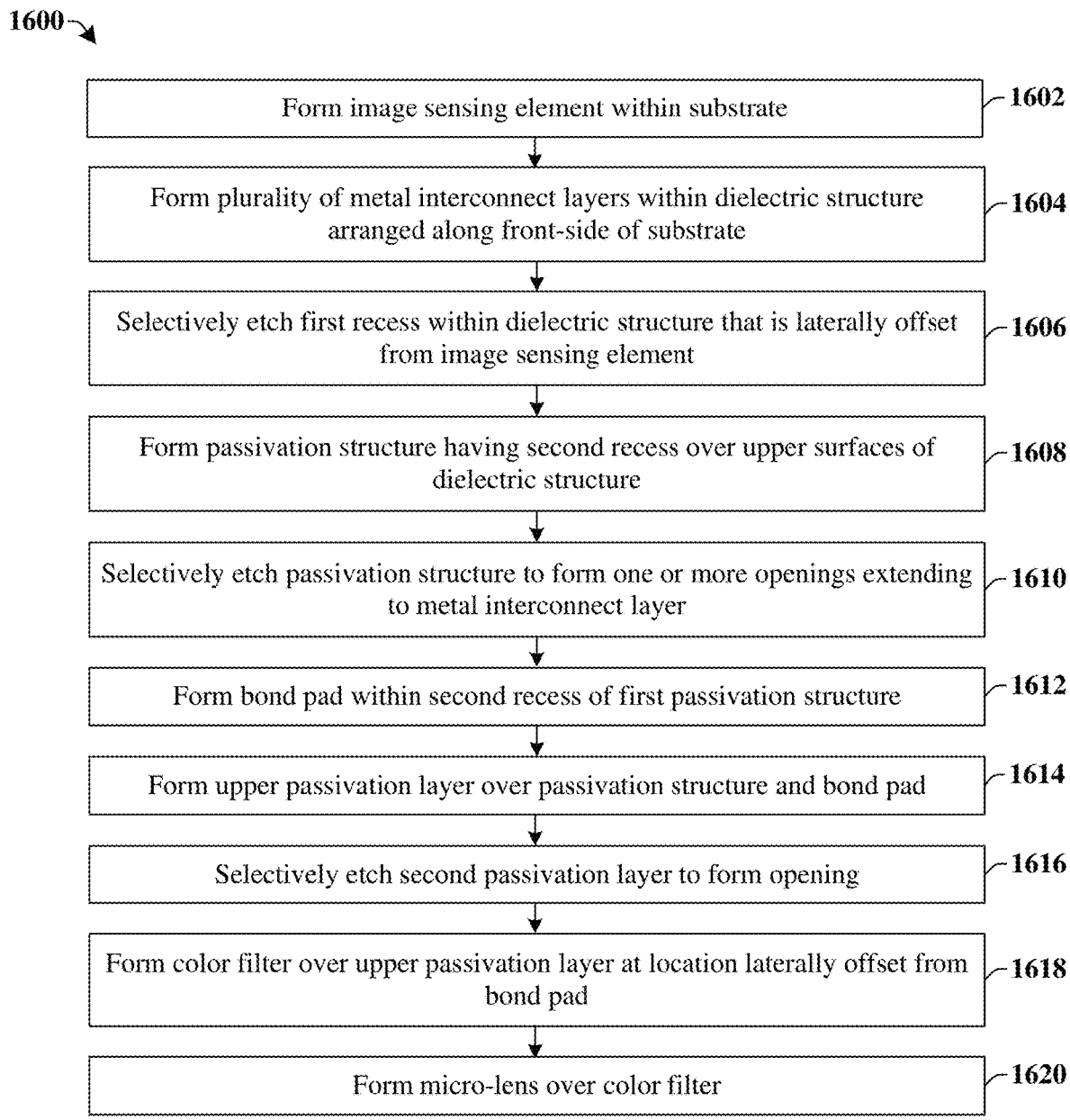
FIG. 16 illustrates a flow diagram of some embodiments of a method of forming a FSI image sensor having a bond pad.

FIG. 16 illustrates a flow diagram of some embodiments of a method of forming a FSI image sensor having a bond pad. Although method 1600 is described in relation to FIGS. 7-15, it will be appreciated that the method 1600 is not limited to such structures, but instead may stand alone as a method independent of the structures.

Furthermore, while the disclosed method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 7:
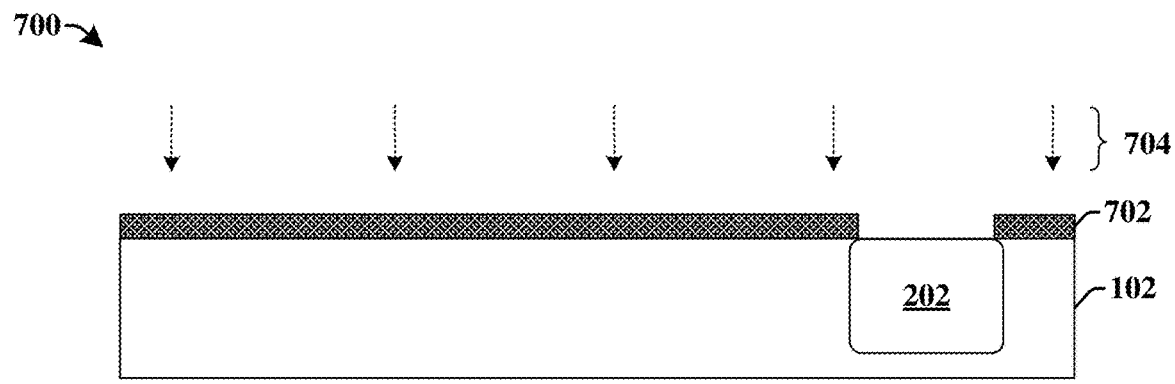
FIGS. 7-15 illustrate cross-sectional views of some embodiments of a method of forming a FSI image sensor having a bond pad.

At 1602, an image sensing element is formed within a substrate. In some embodiments, the image sensing element comprises a photodiode formed by performing a first implantation process within a front-side of the substrate. FIG. 7 illustrates some embodiments corresponding to act 1602.

Figure 8:
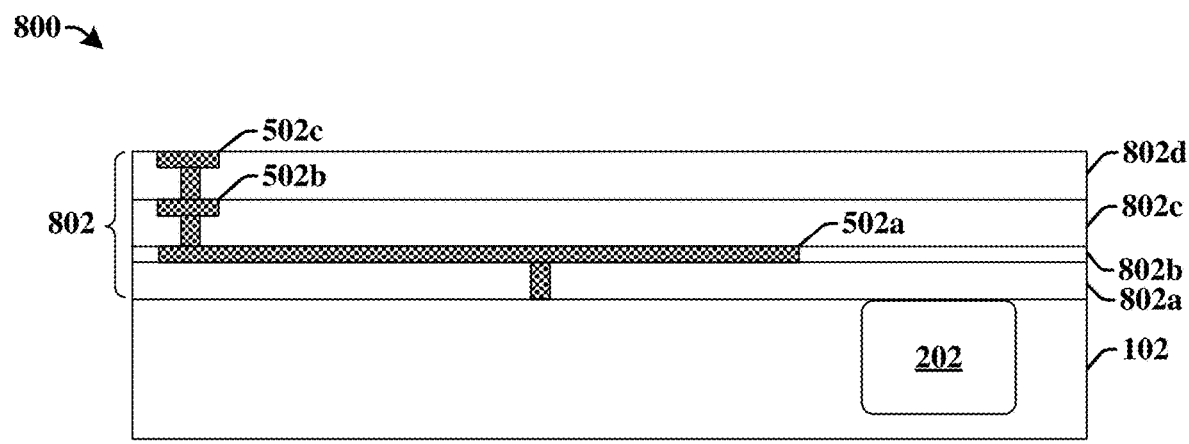

At 1604, a plurality of metal interconnect layers are formed within a dielectric structure arranged over the substrate. FIG. 8 illustrates some embodiments corresponding to act 1604.

Figure 9:
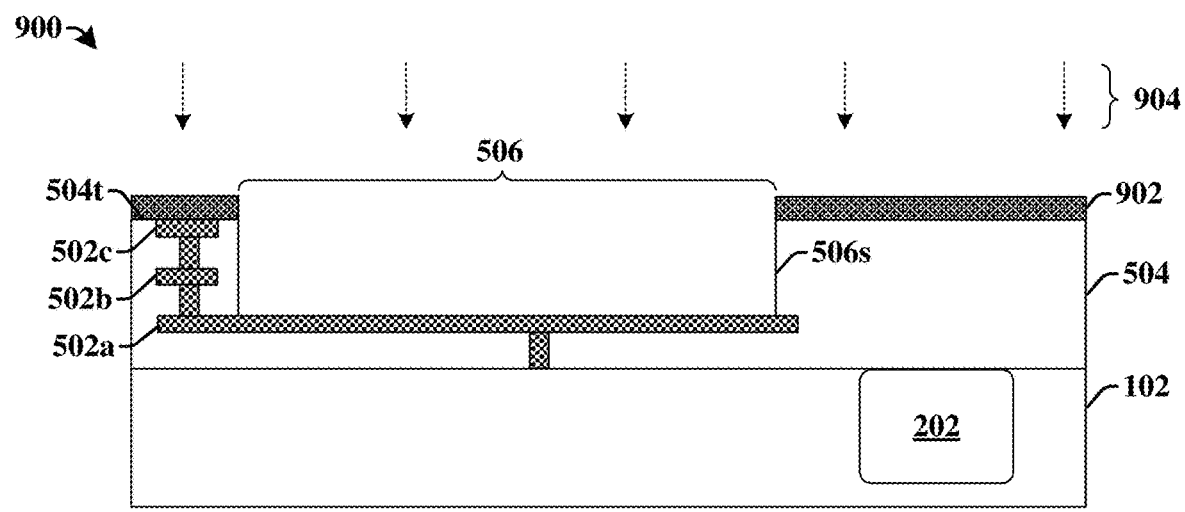

At 1606, a first recess may be etched within the dielectric structure at a location that is laterally offset from the image sensing element. FIG. 9 illustrates some embodiments corresponding to act 1606.

Figure 10:
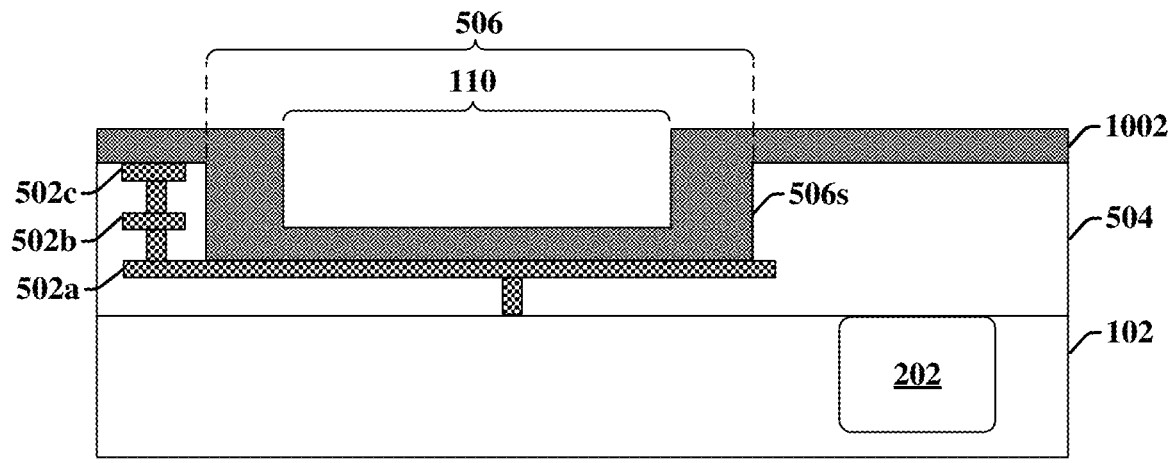

At 1608, a passivation structure is formed over upper surfaces of dielectric structure. The passivation structure has a second recess within its upper surface. FIG. 10 illustrates some embodiments corresponding to act 1608.

Figure 11:
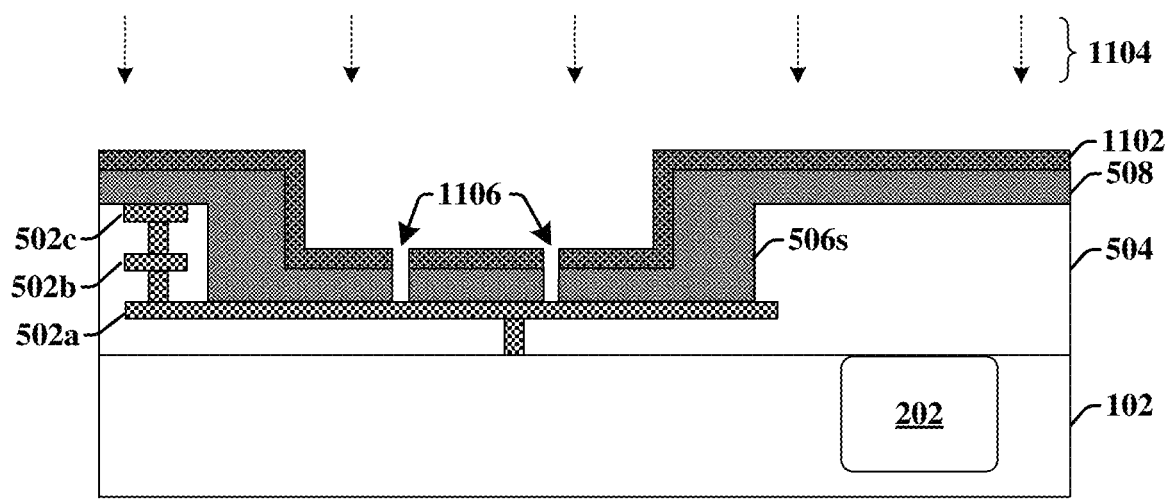

At 1610, the passivation structure is selectively etched to form one or more openings extending through the passivation structure to one of the plurality of metal interconnect layers. FIG. 11 illustrates some embodiments corresponding to act 1610.

Figure 12:
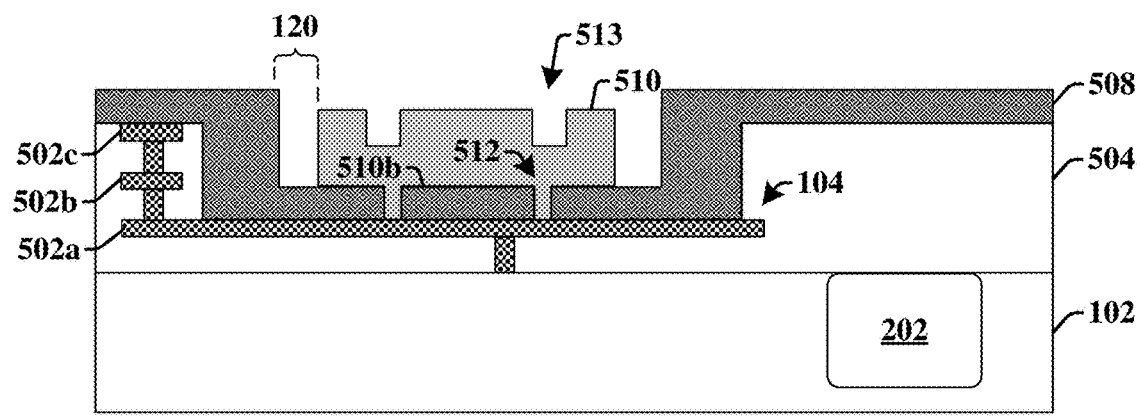

At 1612, a bond pad is formed within the second recess within the passivation structure. FIG. 12 illustrates some embodiments corresponding to act 1612.

Figure 13:
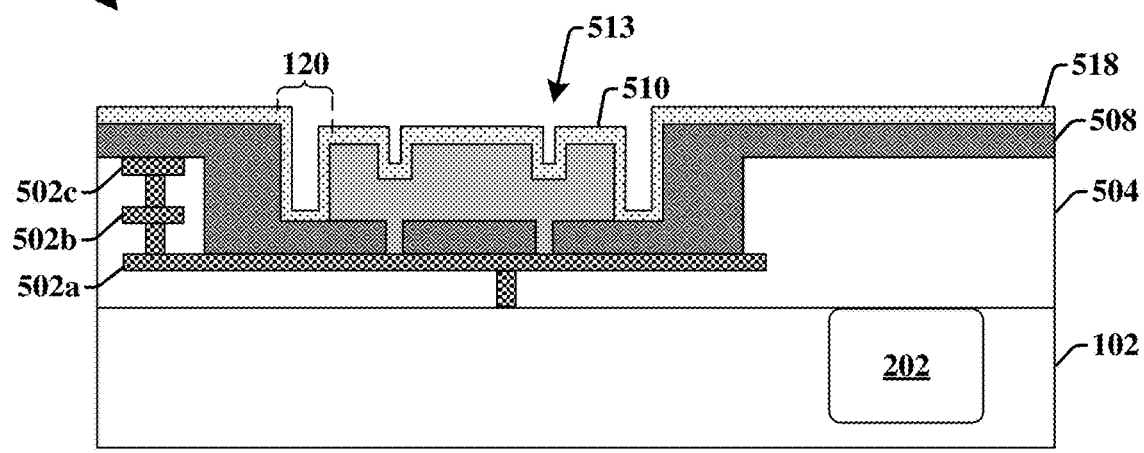

At 1614, an upper passivation layer is formed over the passivation structure and the bond pad. FIG. 13 illustrates some embodiments corresponding to act 1614.

At 1616, the upper passivation layer is selectively etched to form an opening in communication with the bond pad. FIG. 13 illustrates some embodiments corresponding to act 1616.

At 1618, a color filter is formed over the upper passivation layer at a location that is laterally offset from the bond pad. FIG. 13 illustrates some embodiments corresponding to act 1618.

Figure 14:
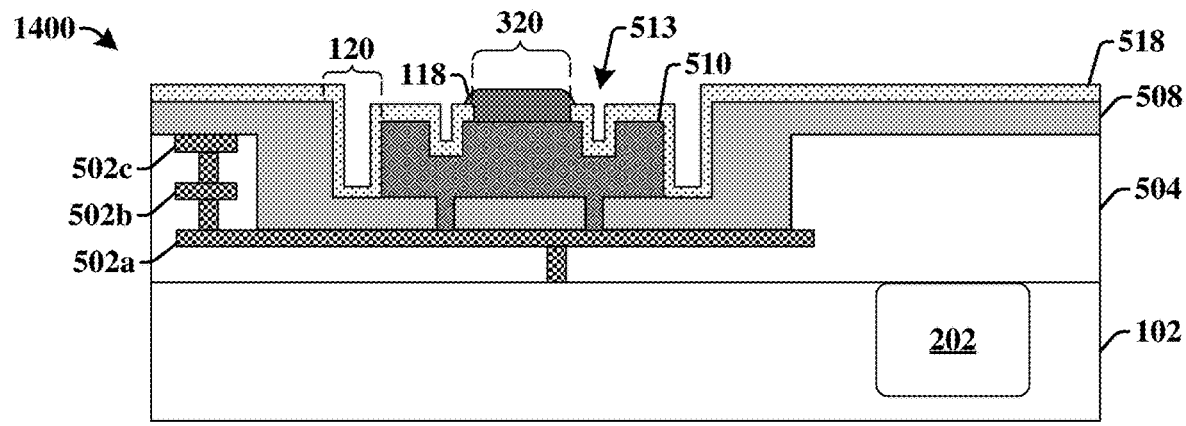
Figure 15:
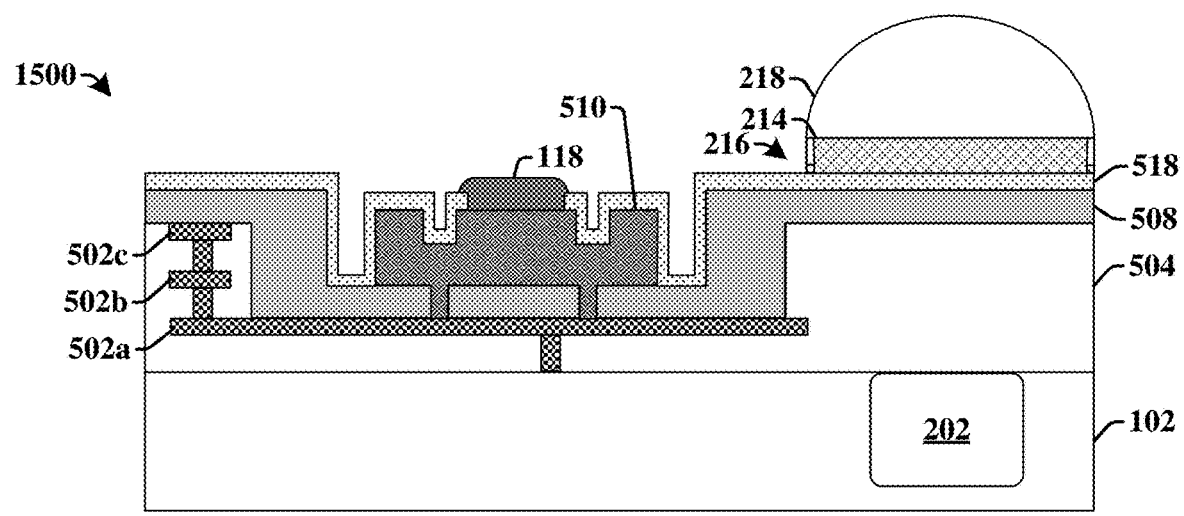

At 1620, a micro-lens is formed over the color filter. FIG. 14 illustrates some embodiments corresponding to act 1620.

Therefore, the present disclosure relates to an integrated circuit having a bond pad that mitigates damage to underlying layers while having a relatively flat surface topography that provides for good image sensor performance.

In some embodiments, the present disclosure relates to an integrated circuit. The integrated circuit comprises a plurality of metal interconnect layers arranged within a dielectric structure over a semiconductor substrate. The integrated circuit further comprises a passivation structure arranged over the dielectric structure and having a recess within an upper surface of the passivation structure. The recess comprises sidewalls connecting a horizontal surface of the passivation structure to the upper surface. The integrated circuit further comprises a bond pad arranged within the recess and having a lower surface that overlies the horizontal surface. The bond pad comprises one or more protrusions extending outward from the lower surface of the bond pad through openings in the passivation structure to contact one of the plurality of metal interconnect layers.

In other embodiments, the present disclosure relates to an integrated circuit. The integrated circuit comprises a plurality of metal interconnect layers arranged within a dielectric structure over a semiconductor substrate, and a passivation structure arranged over the dielectric structure and having a recess comprising sidewalls connected to a horizontal surface of the passivation structure. The integrated circuit further comprises a bond pad arranged within the recess and laterally separated from the passivation structure by a cavity. The bond pad comprises one or more protrusions extending outward from a lower surface of the bond pad through openings in the horizontal surface to vertically contact one of the plurality of metal interconnect layers. The integrated circuit further comprises an upper passivation layer arranged over the passivation structure and the bond pad, and along interior surfaces of the cavity.

In yet other embodiments, the present disclosure relates to a method of forming a bond pad. The method comprises forming a plurality of metal interconnect layers within a dielectric structure over a substrate, and forming a passivation structure over the dielectric structure. The passivation structure has a recess within an upper surface of the passivation structure comprising sidewalls connected to a horizontal surface of the passivation structure. The method further comprises selectively etching the passivation structure to form one or more openings within the horizontal surface. The method further comprises forming a bond pad within the recess. The bond pad has a lower surface overlying the horizontal surface and one or more protrusions extending outward from the lower surface through the one or more openings to contact one of the plurality of metal interconnect layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a dielectric layer having a first dielectric surface and a second dielectric surface opposite to the first dielectric surface, wherein the dielectric layer defines a recess in the first dielectric surface, and the recess includes a sidewall of the dielectric layer;
   a first conductive layer contacting a bottom surface of the dielectric layer, wherein the sidewall of the dielectric layer is directly over the first conductive layer;
   a second conductive layer contacting the first conductive layer and the dielectric layer, wherein the second conductive layer vertically extends from the first conductive layer to above the dielectric layer; and
   a third conductive layer contacting the second conductive layer, wherein the third conductive layer is laterally separated from a sidewall of the second conductive layer that faces the third conductive layer by a non-zero distance.

2. The semiconductor structure of claim 1, wherein the second conductive layer has a single bottommost surface.

3. The semiconductor structure of claim 1, wherein a bottom outermost edge of the third conductive layer is vertically below a top outermost edge of the second conductive layer.

4. The semiconductor structure of claim 1, wherein the third conductive layer has a smaller maximum width than the second conductive layer.

5. The semiconductor structure of claim 1, further comprising:
   an upper dielectric layer arranged over the dielectric layer and laterally and physically contacting the second conductive layer.

6. The semiconductor structure of claim 5, wherein the upper dielectric layer further extends to directly over the second conductive layer.

7. The semiconductor structure of claim 5, wherein the upper dielectric layer comprises one or more sidewalls directly over the second conductive layer, the third conductive layer being directly between the one or more sidewalls.

8. The semiconductor structure of claim 1, wherein the third conductive layer is laterally separated from the sidewall of the dielectric layer by a second non-zero distance that is larger than the non-zero distance.

9. The semiconductor structure of claim 1, wherein a height of the third conductive layer is smaller than a height of the second conductive layer.

10. The semiconductor structure of claim 1, wherein the dielectric layer continuously extends from a bottommost surface contacting a top surface of an interconnect to the first dielectric surface.

11. A semiconductor structure, comprising:
- a dielectric layer having a first dielectric surface and a second dielectric surface opposite to the first dielectric surface, wherein the dielectric layer defines a recess in the first dielectric surface and the recess includes a sidewall; and
- a bonding pad disposed in the recess, wherein a first pad surface of the bonding pad is adjacent to the first dielectric surface, a second pad surface of the bonding pad is adjacent to the second dielectric surface, and an edge of the bonding pad is spaced from the sidewall of the recess by a first distance.

12. The semiconductor structure of claim 11, further comprising:
- an upper dielectric layer continuously extending from a lower surface contacting a top of the dielectric layer to directly over a top surface of the bonding pad.

13. The semiconductor structure of claim 12, further comprising:
- an upper conductive material arranged on the bonding pad and directly between sidewalls of the upper dielectric layer.

14. The semiconductor structure of claim 11, wherein the bonding pad vertically extends to a horizontal plane that is parallel to and that is disposed along an uppermost surface of the dielectric layer.

15. The semiconductor structure of claim 14, wherein the bonding pad has a greater maximum height than the dielectric layer.

16. The semiconductor structure of claim 11, wherein the bonding pad protrudes outward from a topmost surface of the dielectric layer.

17. A semiconductor structure, comprising:
- a plurality of interconnects within a dielectric structure over a substrate;
- a passivation structure arranged over the dielectric structure and having sidewalls connected to one or more upper surfaces of the passivation structure;
- a bond pad arranged directly between the sidewalls of the passivation structure, wherein the bond pad comprises a lower sidewall laterally and physically contacting the passivation structure and an upper sidewall that is laterally separated from the passivation structure by a non-zero distance; and
- wherein the passivation structure comprises a pair of sidewalls that face one another and that are arranged along a same side of the bond pad.

18. The semiconductor structure of claim 17, further comprising:
- a conductive material arranged on the bond pad, wherein the bond pad laterally extends past opposing outermost sides of the conductive material.

19. The semiconductor structure of claim 17, further comprising:
- an upper dielectric layer physically contacting the passivation structure and the bond pad.

20. The semiconductor structure of claim 19, wherein the upper dielectric layer comprises sidewalls that face one another and that are separated by a second non-zero distance, the sidewalls arranged along the same side of the bond pad.

* * * * *